United States Patent
Sobek et al.

(10) Patent No.: US 6,329,687 B1
(45) Date of Patent: Dec. 11, 2001

(54) TWO BIT FLASH CELL WITH TWO FLOATING GATE REGIONS

(75) Inventors: Daniel Sobek, Portola Valley; Timothy Thurgate, Sunnyvale; Carl Robert Huster, Sunnyvale; Masaaki Higashitani, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/492,353

(22) Filed: Jan. 27, 2000

(51) Int. Cl.[7] .................................................... H01L 29/76
(52) U.S. Cl. .................... 257/314; 257/401; 257/315; 257/316; 257/317; 257/321; 257/390; 438/264
(58) Field of Search ..................................... 257/315, 316, 257/317, 321, 390, 401; 438/264

(56) References Cited

U.S. PATENT DOCUMENTS

| | | | |
|---|---|---|---|
| 5,284,572 | * 2/1994 | Manley | 437/43 |
| 5,516,713 | * 5/1996 | Hsue et al. | 437/43 |
| 5,768,192 | 6/1998 | Eitan | 365/185.24 |
| 5,770,501 | 6/1998 | Hong | 438/264 |
| 5,943,267 | * 8/1999 | Sekariapuram et al. | 365/185.28 |
| 5,943,572 | * 8/1999 | Krautschneider | 438/259 |

FOREIGN PATENT DOCUMENTS

WO 990/07000  2/1999 (WO).

* cited by examiner

Primary Examiner—Fetsum Abraham
Assistant Examiner—Leonardo Andújar
(74) Attorney, Agent, or Firm—Amin & Turocy, LLP

(57) ABSTRACT

The method of fabricating the semi-conductor device includes forming a center dielectric region on a substrate. The center dielectric region has a first thickness and the substrate includes a first conductive material. Then, a first plurality of spacers is formed near the center dielectric region. A second conductive material is implanted into the substrate using the first plurality of spacers for alignment. The second conductive material form sources/drains the first plurality of spacers are then removed and a dielectric layer is formed over the substrate and the source/drain regions. The dielectric layer has a second thickness that is less than the first thickness. A second plurality of spacers is formed near the center dielectric region. The second plurality of spacers are conductive and have a third thickness that is substantially equal to the difference of the first and second thickness'. A gate dielectric layer is formed over the substrate, center dielectric region, and second plurality of spacers. Finally, a control gate layer is formed over the gate dielectric layer.

9 Claims, 4 Drawing Sheets

TWO BIT FLASH CELL WITH TWO FLOATING GATE REGIONS

BACKGROUND OF THE INVENTION

This invention relates generally to semiconductor memory devices and more particularly to a two bit flash memory device.

Semiconductor based memory devices largely comprise Random Access Memories (RAM) and Read Only Memories (ROM). RAM is referred to as volatile memory, in that when supply voltage is removed, data is destroyed with the passage of time. ROM devices, including Programmable ROM (PROM), Erasable PROM (EPROM), and Electrically EPROM (EEPROM). Numerous EEPROM cells and flash memory cells can be simultaneously erased, and are characterized by a stacked gate structure comprising a floating gate and a control gate.

Flash memory cells can be grouped into NAND type and NOR type circuits. NAND flash memory cells have n cell transistors connected in series and are connected in parallel between bit lines and ground lines. NAND flash memory cells are useful in large scale integration. NOR flash memory cells include cell transistors that are connected in parallel between bit lines and ground lines. NOR flash memory cells provide high-speed operation.

Conventional flash memory cells operate as follows. A cell is programmed by applying a relatively high voltage (Vg), for example 12 volts, to a control gate and a moderately high voltage (Vd), for example 9 volts, is applied to the drain in order to produce "hot electrons", that is high energy electrons, in the channel near the drain. The hot electrons accelerate across the tunnel oxide and into the floating gate. The hot electrons are trapped in the floating gate that is surrounded by an insulator. A gate is a "floating gate" when it is located between a control gate and a substrate, and is not connected to a wordline, bitline, or other line. The insulators can include the interpoly dielectric and the tunnel oxide. The trapped electrons cause the threshold voltage of the cell to increase by approximately 3 to 5 volts. The cell is programmed by this change in the threshold voltage and the channel conductance of the cell created by the trapped electrons. The floating gate can hold its charge almost indefinitely, even after power is turned off to the memory cell. Such a memory cell is called "nonvolatile". The memory cell can be a flash EEPROM, and EEPROM, or other programmable nonvolatile memory.

The memory cell is read by applying a predetermined voltage (Vg) to the control gate. Vg is greater than the threshold voltage of an unprogrammed cell and less than the threshold voltage of a programmed cell. If the cell conducts, then the cell has not been programmed. The cell is said to be at a first lower logic state, for example "zero". Likewise, if the cell does not conduct, then the cell has been programmed. The cell is at a second higher logic state, for example "one".

The flash memory cell is erased by applying a relatively high voltage (Vs), for example 12 volts, to the source, ground (Vg=0) is applied to the control gate, and the drain floats. A strong electric field is developed across the tunnel oxide between the floating gate and the source region. Some electrons are trapped in the floating gate flow toward the portion of the floating gate overlying the source region and are extracted from the floating gate and into the source region by way of tunneling through the tunnel oxide. The electrons are removed from the floating gate, and the cell is erased.

The memory cell is activated by applying a voltage to the control gate. When the control gate is coupled to a voltage level, the two bit memory cell is enabled. The memory cell is in a non-conducting state when not enabled.

BRIEF SUMMARY OF THE INVENTION

This invention relates to the method of fabricating a two bit semi-conductor device and the resulting apparatus.

The method of fabricating the semi-conductor device includes forming a center dielectric region on a substrate. The center dielectric region has a first thickness and the substrate includes a first conductive material. Then, a first plurality of spacers is formed near the center dielectric region. A second conductive material is implanted into the substrate using the first plurality of spacers for alignment. The second conductive material forms sources/drains. the first plurality of spacers are then removed and a dielectric layer is formed over the substrate and the source/drain regions. The dielectric layer has a second thickness that is less than the first thickness. A second plurality of spacers is formed near the center dielectric region. The second plurality of spacers are conductive and have a third thickness that is substantially equal to the difference of the first and second thickness. A gate dielectric layer is formed over the substrate, center dielectric region, and second plurality of spacers. Finally, a control gate layer is formed over the gate dielectric layer.

A two bit semi-conductor memory device includes a substrate, a dielectric layer, a center dielectric region, a plurality of spacer regions, a gate dielectric layer, and a control gate layer. The semiconductor substrate includes a first conductive materials and regions of a second conductive material. The second conductive material are source/drain regions. The dielectric layer with a first thickness covers the semiconductor substrate. The center dielectric region with a second thickness covers the substrate. The second thickness is greater than the first thickness. The plurality of spacer regions are located near the center dielectric region. Each spacer region is separated from the others by the center dielectric region and each spacer region is substantially the thickness of the difference between the second and first thickness. The gate dielectric layer covers the plurality of polysilicon layers and the center dielectric layer. Finally, a control gate layer covers the gate dielectric layer.

BRIEF DESCRIPTION OF SEVERAL VIEWS OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION OF THE INVENTION

Figure 1:
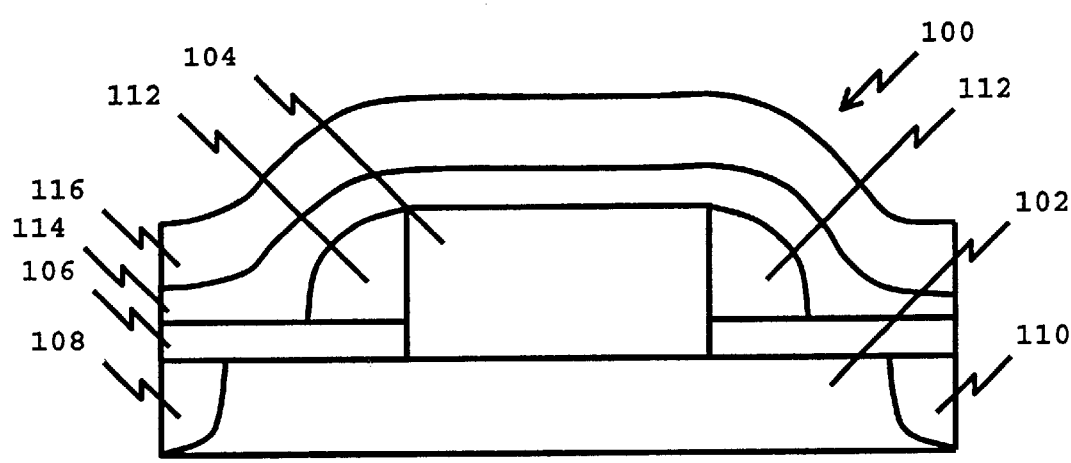
FIG. 1 is a cross-sectional view of two-bit memory cell.

FIG. 1 shows a cross-section of a two-bit memory cell 100 with two floating gate regions. The two-bit memory cell 100 can be a flash memory cell, an EEPROM cell, or another similar cell. The two-bit memory cell 100 includes a substrate 102, a center dielectric region 104, a tunnel dielectric layer 106, a plurality of spacers 112, a gate dielectric layer 114, and a control gate layer 116. The substrate 102 includes source/drain regions 108 and 110. The center dielectric region 104 and the tunnel dielectric layer 106 can include oxide. The plurality of spacers 112 can include polysilicon. The gate dielectric layer 114 can include a silicon oxide/silicon nitride/silicon oxide ("ONO") layer. The control gate layer 116 is also called a wordline layer.

Figure 2:
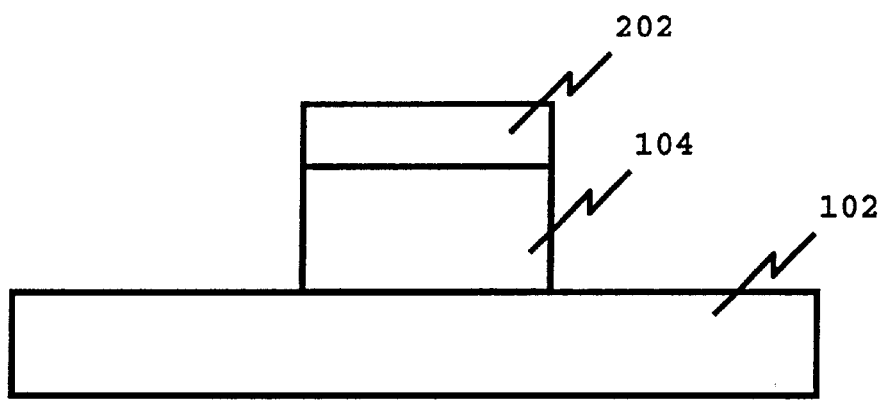
FIG. 2 is a cross-sectional view of the two-bit memory cell during manufacturing after photoresist development.

FIG. 2 illustrates the result of the first step of fabricating a two-bit memory cell 100 (FIG. 1). FIG. 2 shows a cross-section of a substrate 102 with a center dielectric region 104 and a photoresist layer 202. The substrate 102 can include silicon or other semiconductor materials. A blank substrate 102 was coated with a dielectric layer, such as oxide, then a photoresist layer. A photo mask was used to expose the photoresist and then the photoresist was developed, resulting in the configuration shown in FIG. 2. The center dielectric region 104 has a thickness of "$Tox_c$". The center dielectric region 104 should preferably be of minimum feature size. The minimum size of the center dielectric region 104 is determined by the limits of the photolithography or similar process. Currently sub-micron dimensions, such as 0.5 and 0.1 microns, are possible. Additionally, subsequent processing, such as back etching, can reduce the dimensions further.

Figure 3:
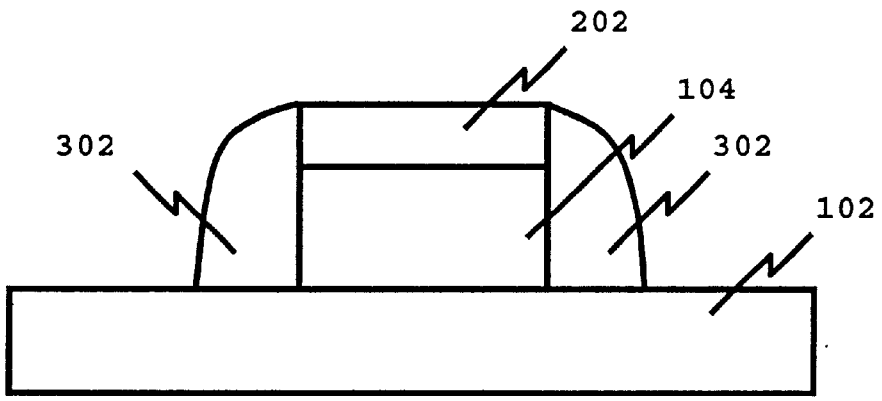
FIG. 3 is a cross-sectional view of the two-bit flash memory during manufacturing after photoresist alignment spacers are deposited.
Figure 4:
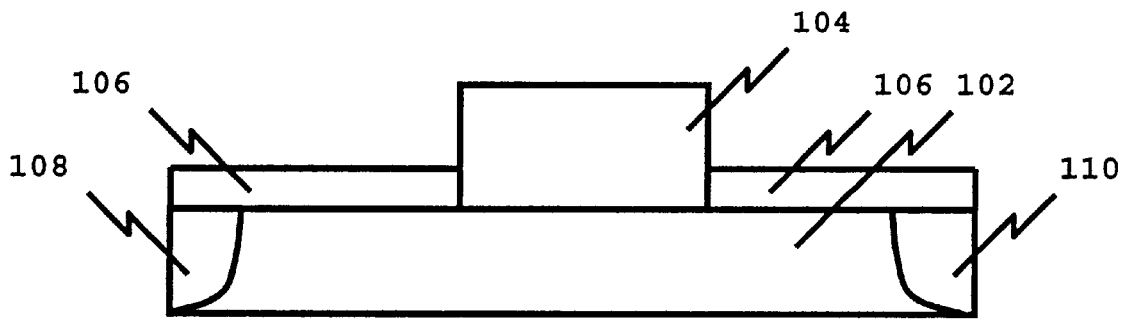
FIG. 4 is a cross-sectional view of the two-bit memory cell during manufacturing after source and drains are created and a second oxide layer is deposited.

FIG. 3 shows the substrate 102 with spacers 302. The spacers 302 can be made of photoresist. The photoresist spacers 302 are used to align the source/drain regions 108 and 110 (FIG. 4). It is preferable that the photoresist spacers 302 be between 100 and 500 Angstroms wide.

FIG. 4 shows the substrate 102 with the photoresist layer 202 (FIG. 3) and the spacers 302 removed and a tunnel dielectric layer 106 deposited on the substrate 102. The tunnel dielectric layer 106 has a thickness of "Tox" and can include oxide. It is preferable that Tox be between 100 and 400 Angstroms thick.

Figure 5:
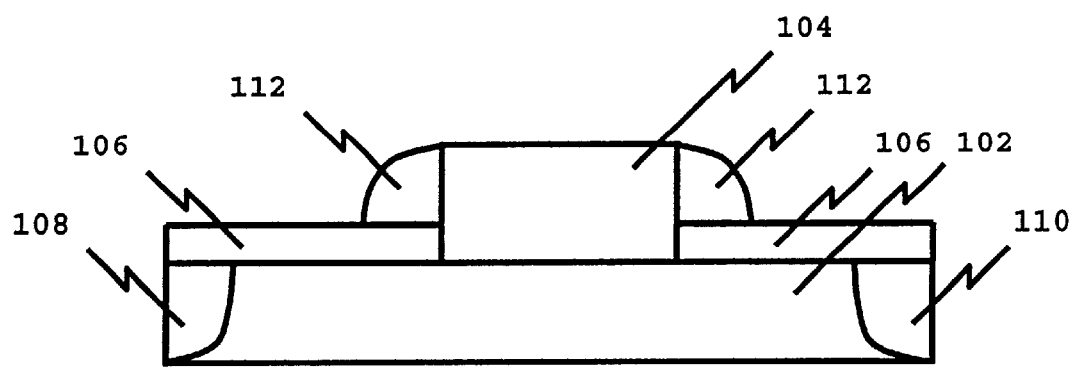
FIG. 5 is a cross-sectional view of the two-bit memory cell during manufacturing after polysilicon spacers are deposited.

FIG. 5 shows the substrate 102 with spacers 112 formed over the tunnel dielectric layer 106 adjacent to the center dielectric region 104. The spacers 112 can include polysilicon. Two or more polysilicon spacers 112 can be deposited adjacent to the center dielectric region 104. Each spacer 112 can contain a separate bit of memory.

Figure 6:
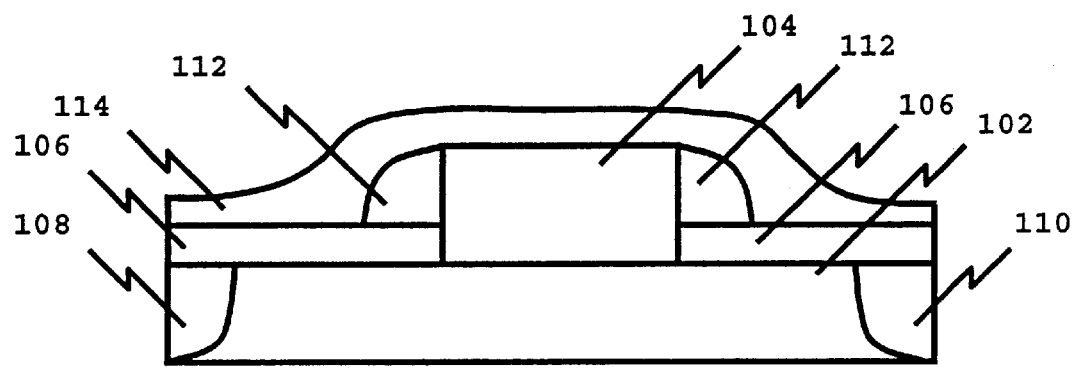
FIG. 6 is a cross-sectional view of the two-bit memory cell during manufacturing after an ONO layer is deposited.

FIG. 6 shows the substrate 102 with a gate dielectric layer 114 deposited over the tunnel dielectric layer 106, spacers 112, and the center dielectric region 104. The gate dielectric layer 114 can include an ONO layer of silicon oxide/silicon nitride/silicon oxide sub-layers. The polysilicon spacers 112 preferably have a thickness of $Tox_c$–Tox. The top of the polysilicon spacers 112 should be substantially flush with the top of the center dielectric region 104.

Referring once again to FIG. 1, the substrate 102 is shown with a control gate (wordline) layer 116 deposited over the gate dielectric layer 114. The control gate layer 116 controls programming the cell 100. The control gate layer 116 is also referred to as the wordline. The control gate layer 116 can include polycide, polysilicon and any of the following: silicide, cobalt, titanium, tungsten, and/or metal polycide. A polycide layer includes a polysilicon layer and a silicide layer. The thickness of the control gate layer 116 should be between 100 and 400 Angstroms. A "wordline" typically comprises a layer of gate level polysilicon passing alternately over field oxide and over the channel regions of access in the memory cells. The voltage signal on the wordline can be switched from a low to a high voltage. This turns the access on and electrically connects the cell's storage capacitor to a bitline for sensing (enables access). Changing the voltage signal on the wordline from a high to a low voltage terminates access(disables access).

For example, the control gate (wordline) layer 116 can include polycide deposited to a thickness of between 2500 and 4000 angstroms. The polycide may include polisilicon between 1200 to 2000 angstroms thick, and silicides between 1000 to 2000 angstroms thick. The silicide can be one or more of the following: tungsten silicide (WSi2), molybdenum silicide (MoSi2), titanium silicide (TiSi), or cobalt silicide (CoSi2).

The two bit memory cell 100 can be an NMOS device. By having a two bit memory cell, the amount of data storage is double compared to the same size silicon with single bit memory cells. That is, the memory density is increased.

Figure 7:
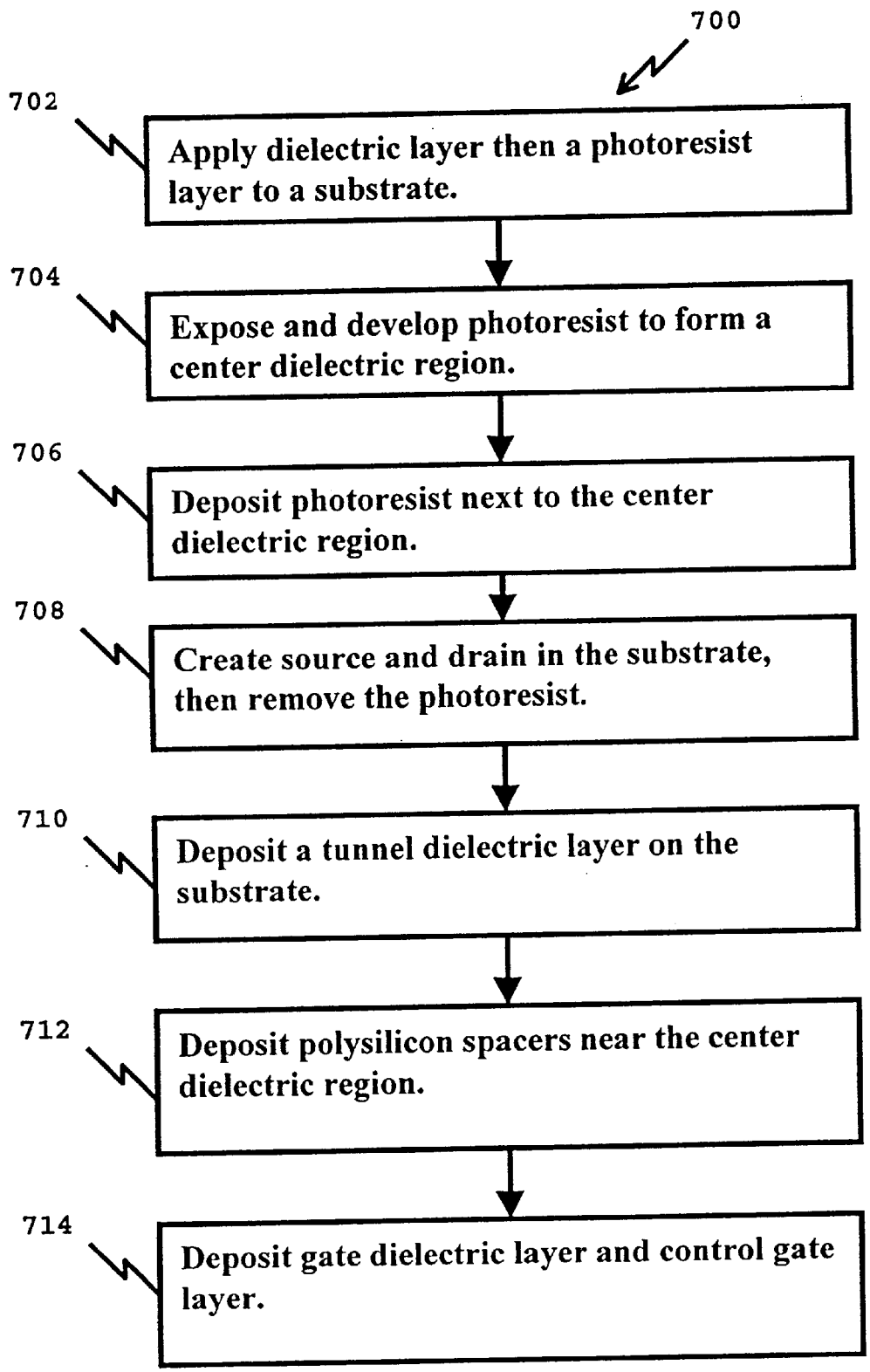
FIG. 7 is a flow diagram of the process for forming a two-bit flash cell.

FIG. 7 shows the process 700 of fabricating a two bit memory cell without spill over charge effect. The spill over charge effect is when accessing, programming, or erasing of one of the two bits affects the other bit.

In step 702, a photoresist layer 202 (FIG. 2) is formed over a dielectric layer 104 (FIG. 2) on a substrate 102 (FIG. 2).

In step 704, the photoresist 202 is exposed and developed forming a center dielectric region 104 (FIG. 1). The center dielectric region 104 is formed with minimum feature size. The height of the center dielectric region 104 is $Tox_c$.

In step 706, first spacers 302 (FIG. 3) are formed next to or near the center dielectric region 104. The first spacers 302 can be formed from photoresist or other suitable materials. The first spacers 302 can be deposited in their final form or they can be deposited then etched to create their final form.

In step 708, source/drain regions 108 and 110 are implanted in the substrate. The source/drain regions 108 and 110 are implanted using the first spacers 302 for alignment. Then the first spacers 302 are removed.

In step 710, a tunnel dielectric layer 106 (FIG. 4) is formed on substrate 102. The tunnel dielectric layer 106 is a thin gate dielectric layer formed on the surface of the substrate.

In step 712, second spacers 112 (FIG. 5) are deposited near the center dielectric region 104 (FIG. 5). The second spacers 112 can include polysilicon. The top of the second spacers 112 should be substantially as high as the top of the center dielectric region 104. The thickness of the second spacers 112 should be approximately $Tox_c$–Tox.

In step 714, a gate dielectric layer 114 (FIG. 6) is formed then a control gate layer 116 (FIG. 6) is formed. The gate dielectric layer 114 can include layers of silicon oxide, silicon nitride, and silicon oxide ("ONO").

The two bit memory cell 100 is programmed and erased with high voltages used to transfer charge to and remove charge from the floating gate 112 through the gate dielectric layer 114. The methods of applying the high voltages include avalanche injection, channel injection, hot electrons, quantum-mechanical tunneling, and others. The two bit memory cell 100 (FIG. 1) can be programmed by injecting hot electrons, generated in the drain region, into the floating gate. Hot electrons can be channel hot electron ("CHE"), secondary electron injection ("SEI"), or other. Hot electrons lose their energy in the drain by a process called impact ionization. Impact ionization creates electron-hole pairs. The pairs migrate and become injected within the gate dielectric near the drain junction. This creates a net negative charge density in the gate dielectric. The charge accumulates over time, causing a threshold shift.

Using the IEEE convention terms, a memory cell is "programmed" when it is in an "off" or nonconducting state, and the memory cell is "erased" when it is in an "on" or conducting state.

The memory cell can be read by coupling a pull-up device such as a resistor, to the drain. When the memory cell is erased, the memory cell will conduct and the drain of the memory cell will be pulled low. This indicates that the memory cell is "erased". When the memory cell is programmed, the memory cell will not conduct and the drain node of the memory cell will be pulled high indicating the memory cell is programmed.

The two bit memory cell 100 (FIG. 1) can be read by detecting the operational characteristic of the memory cell transistor. The operational characteristic varies in accordance with the charge that is stored in the floating gate.

The two bit memory cell 100 can be erased in a variety of manners including by Fowler-Nordheim ("FN") tunneling and hot holes. FN tunneling involves applying a voltage across the dielectric region to increase the probability of an electron tunneling through. Hot holes are valence electrons with high energies.

Many two bit cells can be connected together to form a memory bank. Each bit can be separately accessed.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A semi-conductor device comprising:

(a) a semiconductor substrate including a first conductive material including regions of a second conductive material, the second conductive material forming source/drain regions;

(b) a dielectric layer above the semiconductor substrate, the dielectric layer having a first thickness;

(c) a center dielectric region only above the upper surface of the substrate, the center dielectric region having a second thickness, the second thickness being greater than the first thickness;

(d) a plurality of gate regions near to the center dielectric region, each gate region being separated from the others by the center dielectric region and each gate region being substantially the thickness of the difference between the second and first thickness;

(e) a gate dielectric layer covering the plurality of gate regions and the center dielectric layer; and (f) a control gate layer covering the gate dielectric layer.

2. The semi-conductor device of claim 1 wherein each of the plurality of spacer regions includes polysilicon.

3. The semi-conductor device of claim 1 wherein the center dielectric region is formed with minimum dimensions.

4. The semi-conductor device of claim 1 wherein the gate dielectric layer includes an ONO layer of silicon oxide, silicon nitride, and silicon oxide sub-layers.

5. The semi-conductor device of claim 1 wherein the center dielectric region includes oxide.

6. The semi-conductor device of claim 1 wherein the dielectric layer includes oxide.

7. The semi-conductor device of claim 1 wherein the second conductive material includes arsenic.

8. The semi-conductor device of claim 1 wherein the plurality of spacers are between 100 and 500 Angstroms thick.

9. The semi-conductor device of claim 1 wherein the plurality of spacers are spaced between 100 and 500 Angstroms from each other.

* * * * *